(12) United States Patent
Tachibana et al.

(10) Patent No.: US 7,067,903 B2
(45) Date of Patent: Jun. 27, 2006

(54) HEAT SPREADER AND SEMICONDUCTOR DEVICE AND PACKAGE USING THE SAME

(75) Inventors: Takeshi Tachibana, Kobe (JP); Kazushi Hayashi, Kobe (JP); Kenichi Inoue, Kobe (JP); Yoshihiro Yokota, Kobe (JP); Koji Kobashi, Kobe (JP); Nobuyuki Kawakami, Kobe (JP); Takashi Kobori, Kobe (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 143 days.

(21) Appl. No.: 10/701,499

(22) Filed: Nov. 6, 2003

(65) Prior Publication Data
US 2004/0238946 A1    Dec. 2, 2004

(30) Foreign Application Priority Data
Nov. 7, 2002  (JP) ............................ 2002-324473
Nov. 7, 2002  (JP) ............................ 2002-324543

(51) Int. Cl.
*H01L 29/06* (2006.01)
*H01L 23/495* (2006.01)
*H01L 23/06* (2006.01)
*H01L 23/10* (2006.01)

(52) U.S. Cl. .................. 257/625; 257/675; 257/705; 257/706; 257/707; 257/709

(58) Field of Classification Search .............. 257/625, 257/675, 705, 706, 707, 709
See application file for complete search history.

(56) References Cited

U.S. PATENT DOCUMENTS

| 4,914,551 A | * | 4/1990 | Anschel et al. ............. 361/714 |
| 5,391,914 A | * | 2/1995 | Sullivan et al. ............. 257/635 |
| 5,396,403 A | * | 3/1995 | Patel ........................... 361/705 |
| 6,337,513 B1 | * | 1/2002 | Clevenger et al. ........... 257/706 |
| 6,579,743 B1 | * | 6/2003 | Clevenger et al. ........... 438/105 |
| 6,627,980 B1 | * | 9/2003 | Eldridge ...................... 257/678 |
| 6,652,958 B1 | * | 11/2003 | Tobita ...................... 428/298.1 |
| 6,673,649 B1 | * | 1/2004 | Hiatt et al. .................. 438/105 |
| 6,724,631 B1 | * | 4/2004 | Ye et al. ....................... 361/719 |
| 6,770,966 B1 | * | 8/2004 | Chrysler et al. ............. 257/706 |
| 2001/0004546 A1 | * | 6/2001 | Tobita et al. ................ 438/519 |
| 2002/0141155 A1 | * | 10/2002 | Pinneo ........................ 361/688 |
| 2004/0191558 A1 | * | 9/2004 | Ishikawa et al. ............. 428/615 |

FOREIGN PATENT DOCUMENTS
JP    9-129793    10/1995
JP   10-275879    3/1997

* cited by examiner

*Primary Examiner*—Long Pham
*Assistant Examiner*—Shrinivas H Rao
(74) *Attorney, Agent, or Firm*—Reed Smith LLP; Stanley P. Fisher, Esq.; Juan Carlos A. Marquez, Esq.

(57) ABSTRACT

A semiconductor device and package has a heat spreader directly disposed on the reverse surface of the semiconductor device. This heat spreader includes a diamond layer or a layer containing diamond and ceramics such as silicon carbide and aluminum nitride. The heat spreader is directly formed on a substrate for the semiconductor device. In particular, the heat spreader is composed of a diamond layer and one or two metal or ceramic members, which are bonded to the diamond layer with one or two polymer adhesive layers. This diamond layer has a fiber structure across the thickness or a microcrystalline structure. Cilia are formed on a surface of the diamond layer facing the one or two metal or ceramic members.

5 Claims, 3 Drawing Sheets

HEAT SPREADER AND SEMICONDUCTOR DEVICE AND PACKAGE USING THE SAME

BACKGROUND OF THE INVENTION

1. Field of the Invention

The present invention relates to heat spreaders for semiconductor devices to prevent a temperature rise due to heat generated by the semiconductor devices. In addition, the present invention relates to semiconductor devices and packages with the heat spreaders.

2. Description of the Related Art

To facilitate heat dissipation from semiconductor devices, for example, a semiconductor package with a combination of a high thermal-conductivity ceramic base material and a resin wiring substrate such as a printed circuit board has been proposed in Japanese Unexamined Patent Application Publication No. 10-275879. This semiconductor package includes a semiconductor device mounted on the bottom surface of an aluminum nitride heat spreader and a resin wiring substrate bonded around the semiconductor device. This resin wiring substrate has a wiring layer wired to a signal wiring of the semiconductor device. Semiconductor packages of this type are expected to, for example, meet high power-consumption semiconductor devices and achieve a low-resistance, high-density signal wiring and a low-cost package.

In these semiconductor packages, however, a large semiconductor device of, for example, 20 mm by 20 mm requires a large aluminum nitride substrate. When a metal radiating fin is bonded entirely on the top surface of such a large aluminum nitride substrate, the aluminum nitride substrate may cause defects such as cracking during heat cycles due to the difference in thermal expansion coefficients between the aluminum nitride substrate and the metal radiating fin.

Semiconductor packages using high thermal-conductivity ceramics, such as the above aluminum nitride substrate, or a metal plate, such as a copper plate, as a heat spreader have been used in practice as packages for meeting high power-consumption semiconductor devices. Nevertheless, these semiconductor packages have difficulty in meeting a further increase in the power-consumption of the semiconductor devices. In addition, a heat spreader made of only high thermal-conductivity ceramics decreases the reliability of bonding of a heat sink or a radiating fin in a face-down structure, which is supposed to provide a high heat-dissipation package. On the other hand, a heat spreader made of, for example, a copper plate decreases the reliability of mounting of the semiconductor devices.

FIG. 8 shows a sectional view of an example of known semiconductor packages with a heat spreader. A semiconductor device 102 is mounted on a heat spreader 101, which is bonded over an opening of a ceramic package body 103 such that the semiconductor device 102 is disposed inside the package body 103. A ceramic cover 104 is disposed on the other opening of the package body 103 to seal the semiconductor device 102 in this package.

Such a heat spreader has so far been made of, for example, a composite material of copper and tungsten, aluminum nitride, or silicon carbide. Japanese Unexamined Patent Application Publication No. 9-129793 also discloses a heat transfer plate for semiconductor packages.

The heat dissipation characteristics of these known heat spreaders and semiconductor packages using such heat spreaders seem to have been improved to the limit in terms of the materials used and their structures. Therefore, further improvement of the heat dissipation characteristics is difficult. As a result, the processing speed, output, and degree of integration of semiconductor devices must be controlled to suppress the temperature rise of the packages.

SUMMARY OF THE INVENTION

In order to solve the above problems, an object of the present invention is to provide a semiconductor device and package having a heat spreader that has excellent heat dissipation characteristics; high reliability of mounting of the semiconductor device and bonding of a heat sink or a radiating fin; and high suitability for high power-consumption semiconductor devices. Another object of the present invention is to provide a reliable heat spreader having excellent heat dissipation characteristics for cooling high-speed-processing, high-output semiconductor packages; high thermal conductivity across the plane and thickness; sufficient strength, flatness, and air-tightness; good adhesiveness to semiconductor devices and sealing materials for package bodies; and sufficiently small thermal stress that is generated by changes in temperature during bonding or during use to result in a peeling bonding surface or a defective device, and a semiconductor package using the heat spreader.

The present invention provides a semiconductor device having a heat spreader made of diamond or a diamond-containing material having a thermal conductivity of 350 W/(m·K) or more. This heat spreader is directly disposed entirely or partially on the reverse surface of the semiconductor device.

The diamond-containing material may be a composite of a diamond layer and a ceramic layer or a mixture of diamond particles and ceramic particles. The ceramic layer or the ceramic particles may be at least one of silicon carbide and aluminum nitride.

The heat spreader, for example, may have a transparency of at least 10% to light at wavelengths of 750 nm or less.

The heat spreader is preferably directly disposed on a substrate for the semiconductor device.

The heat spreader may have an irregular surface facing away from the semiconductor device.

The present invention further provides a semiconductor package accommodating the semiconductor device. In this semiconductor package, a metal heat sink or a metal radiating fin may be bonded on a surface of the heat spreader facing away from the semiconductor device.

In this semiconductor package, the metal heat sink or the metal radiating fin is preferably bonded on part of the surface of the heat spreader.

In the semiconductor package, a polymer adhesive layer may be used to bond the metal heat sink or the metal radiating fin on the surface of the heat spreader. In addition, cilia may be formed on the surface of the heat spreader so that the polymer adhesive layer spreads over part of the cilia.

According to the present invention, the heat spreader can dissipate a large amount of heat and improve the reliability of mounting of a semiconductor device or module. Furthermore, the semiconductor package can reliably accommodate, for example, a high power-consumption, large semiconductor device.

The present invention further provides a heat spreader disposed on a semiconductor device accommodated in a sealed semiconductor package to dissipate heat from the semiconductor device. This heat spreader is composed of a diamond layer having a fiber structure across the thickness; and one or two metal or ceramic members bonded on one or both surfaces of the diamond layer.

In this heat spreader, cilia are preferably formed on the one or both bonding surfaces of the diamond layer. These cilia preferably have lengths of 0.2 to 3 µm.

The present invention provides another heat spreader disposed on a semiconductor device accommodated in a sealed semiconductor package to dissipate heat from the semiconductor device. This heat spreader is composed of a diamond layer having a microcrystalline structure; and one or two metal or ceramic members bonded on one or both surfaces of the diamond layer.

In each of these two heat spreaders, the one or two metal or ceramic members may be bonded to the diamond layer with one or two polymer adhesive layers.

In each of these two heat spreaders, the diamond layer preferably has a thermal conductivity of 500 W/(m·K) or more across the plane and thickness, and the bonding surfaces of the diamond layer and the one or two metal or ceramic members preferably have a thermal conductivity of $4 \times 10^6$ W/(m²·K) or more. The diamond layer may be formed by, for example, chemical vapor deposition and may have a thickness of 20 to 100 µm.

These heat spreaders may be provided for semiconductor packages.

As described above, each heat spreader according to the present invention is composed of a diamond layer, which has an extremely high thermal conductivity, and one or two metal or ceramic members, which have a large thermal conductivity. Therefore, the heat spreaders have a thermal conductivity, across the thickness, equal to or more than that of a composite material of copper and tungsten or that of aluminum nitride, both of which have been used for heat spreaders. In addition, the heat spreaders have good airtightness and are not warped or cracked. Furthermore, the heat spreaders, having a nearly equivalent thermal expansion coefficient, across the plane, to that of silicon or ceramics such as alumina, have small thermal stress that is generated by changes in temperature. The heat spreaders are thus prevented from defects such as peeling and cracking, which adversely affect semiconductor devices.

The present invention, therefore, can provide a reliable heat spreader having high thermal conductivity across the plane and thickness; sufficient strength, flatness, and airtightness; good adhesiveness to semiconductor devices and sealing materials for package bodies; and sufficiently small thermal stress that is generated by changes in temperature during bonding or during use to result in a peeling bonding surface or a defective device.

DESCRIPTION OF THE PREFERRED EMBODIMENTS

Embodiments of the present invention will now be described with reference to the attached drawings.

Figure 1A:
FIGS. 1A and 1B are sectional views of semiconductor devices with a heat spreader according to a first embodiment of the present invention.

FIG. 1A is a sectional view of a semiconductor device with a heat spreader according to a first embodiment of the present invention. A heat spreader 2 is directly disposed on the reverse surface of a semiconductor device 1. In the present invention, semiconductor devices include semiconductor modules. This heat spreader 2 is made of diamond or a diamond-containing material having a high thermal conductivity of 350 W/(m·K) or more.

Examples of the diamond-containing material include a composite of a diamond layer and a ceramic layer and a mixture of diamond particles and ceramic particles. Examples of the ceramics used for the diamond-containing material include at least one of silicon carbide and aluminum nitride.

Diamond has a thermal conductivity of up to 2200 W/(m·K). When, however, diamond is used for the heat spreader, the manufacturing cost rises. Therefore, diamond may be effectively combined with ceramics such as silicon carbide and aluminum nitride. A material containing diamond and such ceramics can produce a heat spreader having a thermal conductivity of 350 W/(m·K) or more. This heat spreader provides an excellent heat dissipation effect even for next-next-generation central processing units (CPUs), which will generate heat of 100 W or more.

Aluminum nitride has a thermal conductivity of about 200 W/(m·K), while silicon carbide has a thermal conductivity of about 270 W/(m·K). These ceramics have the highest conductivity next to that of diamond among ceramics. A combination with diamond, such as a composite including a diamond layer and a sintered mixture containing diamond particles, can provide a thermal conductivity of 350 W/(m·K) or more.

The type of the semiconductor device 1 is not limited. The present invention is particularly effective for a high power-consumption, large semiconductor device with, for example, a power consumption of 10 W or more and a size of 10 mm by 10 mm or more.

Figure 1B:
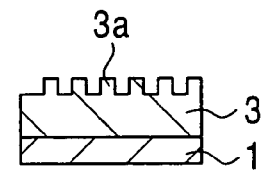

FIG. 1B is a sectional view of a modification of this embodiment. A heat spreader 3 made of diamond or the diamond-containing material (a combination of diamond and ceramics such as silicon carbide and aluminum nitride) has fine irregularities 3a formed on a surface facing away from the semiconductor device 1.

These heat spreaders 2 and 3 have excellent chemical resistance and do not deteriorate either by air cooling or by water cooling. Therefore, the heat spreaders 2 and 3 do not decrease the performance of the semiconductor device 1.

Figure 2A:
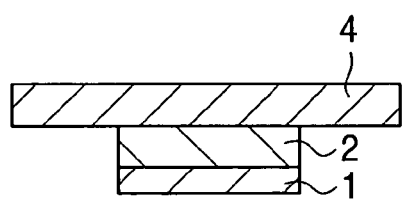
FIGS. 2A and 2B are sectional views of semiconductor devices with a heat spreader according to a second embodiment of the present invention.

FIG. 2A is a sectional view of a semiconductor device with a heat spreader according to a second embodiment of the present invention. A metal heat sink 4 is bonded on the surface of the heat spreader 2 (made of diamond or the diamond-containing material) facing away from the semiconductor device 1.

Figure 2B:
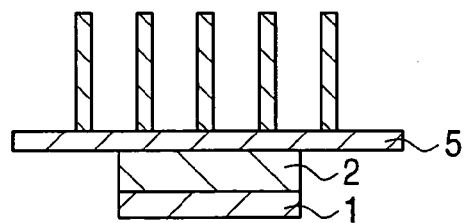

FIG. 2B also shows the semiconductor device 1 with the heat spreader 2 (made of diamond or the diamond-containing material). A metal radiating fin 5 is bonded on the surface of the heat spreader 2 facing away from the semiconductor device 1.

General metal heat sinks and metal radiating fins have largely different thermal expansion coefficients from those of materials for semiconductor devices. On the other hand, the heat spreader 2, which is made of diamond or the diamond-containing material, has a nearly equivalent thermal expansion coefficient to that of the material for the semiconductor device 1. Therefore, the heat spreader 2 not only functions as a heat transfer layer but also as a thermal expansion relieving layer to improve the reliability of mounting of the semiconductor device 1.

Preferably, the heat spreader 2 is almost the same size as the semiconductor device 1 and is formed entirely on the semiconductor device 1. The heat spreader 2 is basically made of a single substrate having no wiring layer. This heat spreader 2, if using the metal heat sink 4 or the metal radiating fin 5 as a ground or having a ground layer, may have a metallized layer or a through hole. The heat spreader 2, if including a diamond layer or a diamond-containing material layer, exhibits excellent transparency to light with wavelengths of 227 nm or more. This heat spreader 2, therefore, functions as a light-emitting/receiving window of optical semiconductors while having no through hole to retain the greatest possible performance as a heat spreader. In particular, a heat spreader directly disposed on the reverse surface of a semiconductor device before or during a step of preparing the semiconductor device, as in the present invention, is effective for a wide variety of semiconductor modules such as diode arrays.

The metal heat sink 4 or the metal radiating fin 5 may be bonded to the heat spreader 2 by various methods. Examples of the-methods include brazing with an active metal, bonding of a metallized heat spreader with solder or general brazing filler metals, and bonding with general resin adhesives.

Figure 3A:
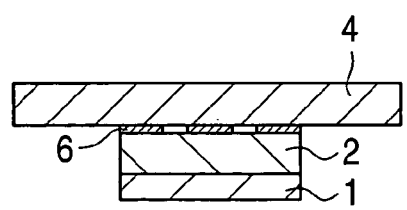
FIGS. 3A and 3B are sectional views of semiconductor devices with a heat spreader according to a third embodiment of the present invention.
Figure 3B:
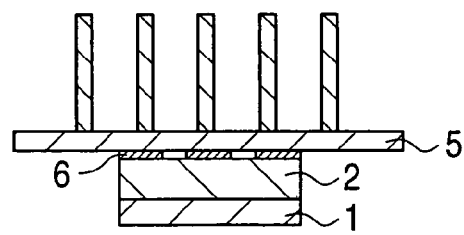

FIGS. 3A and 3B are sectional views of semiconductor devices with a heat spreader according to a third embodiment of the present invention. The metal heat sink 4 or the metal radiating fin 5 is bonded to the heat spreader 2 (made of diamond or the diamond-containing material) with a metal bonding layer 6. This metal bonding layer 6 is provided not entirely but partially on the bonding surfaces of the heat spreader 2 and the metal heat sink 4 or the metal radiating fin 5. The metal bonding layer 6 can reduce stress caused by the difference in thermal expansion coefficients between the different materials. Examples of the material for the metal bonding layer 6 include gold, silver, copper, aluminum, and their alloys.

Figure 4A:
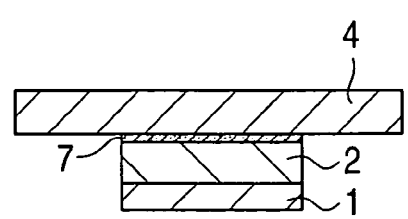
FIGS. 4A and 4B are sectional views of semiconductor devices with a heat spreader according to a fourth embodiment of the present invention.
Figure 4B:
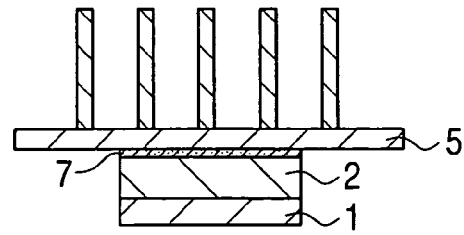

FIGS. 4A and 4B are sectional views of semiconductor devices with a heat spreader according to a fourth embodiment of the present invention. The metal heat sink 4 or the metal radiating fin 5 is bonded to the heat spreader 2 (made of diamond or the diamond-containing material) with a polymer adhesive layer 7, which is a polymer adhesive such as thermosetting resin sheets or pastes. This polymer adhesive layer 7 is provided between the heat spreader 2 and the heat sink 4 or radiating fin 5. If cilia are formed on the bonding surface of the heat spreader 2, the polymer adhesive layer 7 spreads over part of these cilia. The cilia are significantly effective from the viewpoints of adhesion and stress reduction.

To form such cilia, for example, diamond or the diamond-containing material may be treated with direct current (DC) plasma in a 100% hydrogen atmosphere of 1 Torr for 15 to 30 minutes. Silicon carbide and aluminum nitride may also be kept in a vacuum at 1600° C. and 1200° C., respectively, for about 60 minutes to provide the cilia.

The semiconductor device 1 of this embodiment is included in a ball grid array (BGA) package, which has a face-down structure. This package is, for example, mounted on a mounting board such as a multilayer printed circuit board. The semiconductor device 1 with the heat spreader 2 of this embodiment allows a low-resistance, high-density signal wiring and a low-cost, high heat-dissipation package, thus improving the reliability of mounting of the semiconductor device 1 and bonding of the metal heat sink 4 or the metal radiating fin 5.

Figure 5A:
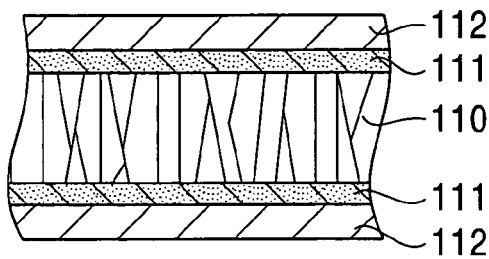
FIG. 5A is a sectional view of a heat spreader according to a fifth embodiment of the present invention.
Figure 5B:
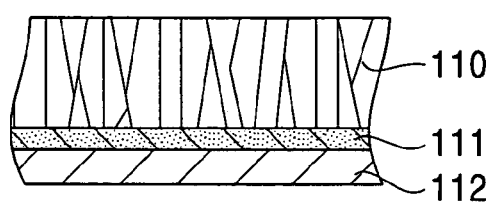
FIG. 5B is a sectional view of a heat spreader according to a modification of the fifth embodiment of the present invention.

FIG. 5A is a sectional view of a heat spreader according to a fifth embodiment of the present invention. This heat spreader includes a diamond layer 110, polymer adhesive layers 111 provided on the top and bottom surfaces of the diamond layer 110, and metal or ceramic members 112 bonded on the polymer adhesive layers 111. FIG. 5B shows a heat spreader according to a modification of this embodiment. In this heat spreader, one polymer adhesive layer 111 and one metal or ceramic member 112 are provided on one surface of the diamond layer 110.

This diamond layer 110 is composed of a polycrystal having a fiber structure across the thickness. The diamond layer 110 can be formed by controlling the conditions of nucleation and deposition by chemical vapor deposition (CVD). The diamond layer 110 has a thickness of, for example, 20 to 100 μm.

An example of methods for forming this diamond layer 110 will now be described. To control the nucleation density, a surface of a substrate (such as a silicon substrate) on which diamond is to be deposited is polished with a diamond powder having an average particle diameter of about 15 to 30 μm. Alternatively, the surface of the substrate is dipped in liquid alcohol containing the same diamond powder to apply supersonic vibration to this liquid for 5 to 15 minutes. After being washed to remove the diamond powder adhered to the surface, this substrate is introduced into diamond deposition equipment. The reactor of this equipment is evacuated and provided with a mixture of hydrogen gas and 3% methane gas to maintain a pressure of 90 Torr in the reactor. Then, microwave plasmas are generated in the reactor while the substrate is kept at 870° C. to 950° C. By this method, deposition was performed for 5 hours to provide a diamond layer having a diameter of 50 μm. Observation of a cross section of this diamond layer by electron microscopy demonstrated that the diamond layer had a fiber structure across the thickness.

The diamond layer 110 has a thermal conductivity of 500 W/(m·K) or more across the plane and thickness. The bonding surfaces of the diamond layer 110 and the metal or ceramic member 112 have a thermal conductivity of $4 \times 10^6$ W/(m²·K) or more.

The diamond layer 110 has a higher thermal conductivity across the plane and thickness than any other material at present used for heat spreaders. This diamond layer 110 can have a thermal conductivity of 500 W/(m·K) or more, irrespective of its crystalline structure. Among various diamond layers, ones having a fiber structure across the thickness, as in this embodiment, are more preferable because such diamond layers provide low grain boundary density to prevent an increase in thermal resistance, thus increasing the thermal conductivity by 50±25%.

These diamond layers serve excellently as the main component of a heat spreader for semiconductor packages from the viewpoints of thermal conductivity, thermal stress during bonding, and air-tightness. In addition, the diamond layers have a sufficient strength and flatness. If, for example, one metal or ceramic member 112 is bonded on only one surface of the diamond layer 110, as in FIG. 5B, the diamond layer 110 may be supposed to warp the heat spreader due to stress concentration at one surface and, in many cases, cause cracking during or after bonding. However, diamond has high mechanical strength, which prevents warpage and cracking in the heat spreader. These diamond layers preferably have a thickness of at least 20 µm, more preferably at least 50 µm, for securing the strength. On the other hand, thicknesses over 100 µm undesirably produce such an excessive mechanical strength as to make it difficult to process the diamond layer, and increase the manufacturing cost.

As shown in FIG. 5A, the top and bottom surfaces of the diamond layer 110 may be bonded with the metal or ceramic members 112, which may be made of the same material or materials having nearly equivalent thermal expansion coefficients. Such metal or ceramic members 112 can generate nearly equivalent thermal stresses at both surfaces of the diamond layer 110 to minimize the warpage of the heat spreader. The members 112 are preferably made of the same material and bonded on the top and bottom surfaces of the diamond layer 110 at the same time.

The polymer adhesive layers 111 for bonding the members 112 to the diamond layer 110 are made of an organic polymer adhesive such as general epoxy resins, phenol resins, or their mixtures. These polymer adhesive layers 111 may contain a powder of a high thermal conductivity metal such as silver, copper, and aluminum. In addition, the polymer adhesive layers 111 may also be made of an inorganic polymer adhesive.

A preferable bonding method will now be described. A surface of the member 112 is uniformly coated with a polymer adhesive having a thickness of 5 to 50 µm, which is dried if containing a solvent. The adhesive surface of the member 112 is overlapped with the diamond layer 110. The polymer adhesive is then polymerized and cured by hot pressing at about 70° C. to 150° C. In this method, more preferably, the polymer adhesive applied on the member 112 is mildly preheated to polymerize the polymer adhesive slightly for use in the state of a solid film at room temperature.

Such a polymer adhesive layer 111 generally has poor thermal-conductivity. This polymer adhesive layer 111, if having a large thickness, decreases-the total thermal conductivity of the heat spreader. Therefore, the polymer adhesive layer 111 preferably has a thickness of 5 µm or less, more preferably, 3 µm or less. The polymer adhesive, before cured, spreads over micropores on the surface of the diamond layer 110, thus providing a highly adhesive, extremely thin polymer adhesive layer.

The members 112 are formed by molding a high thermal conductivity metal with good adhesion, such as silver, copper, aluminum, their alloys, aluminum nitride, and silicon carbide, into, for example, a foil, a plate, or a radiating fin.

Figure 6A:
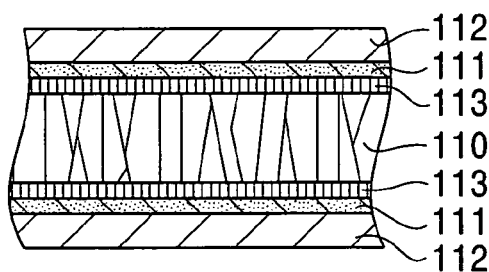
FIG. 6A is a sectional view of a heat spreader according to a sixth embodiment of the present invention.
Figure 6B:
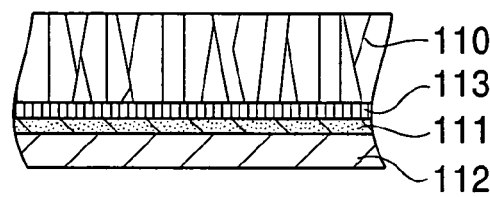
FIG. 6B is a sectional view of a heat spreader according to a modification of the sixth embodiment of the present invention.

FIG. 6A is a sectional view of a heat spreader according to a sixth embodiment of the present invention. In this heat spreader, the members 112 are bonded on the top and bottom surfaces of the diamond layer 110 with the polymer adhesive layers 111. FIG. 6B is a sectional view of a heat spreader according to a modification of this embodiment. In this heat spreader, one member 112 is provided on one surface of the diamond layer 110 with the polymer adhesive layer 111. These heat spreaders are characterized by ciliary diamond layers 113. That is, cilia are formed on one or both bonding surfaces of the diamond layer 110 in this embodiment.

The ciliary diamond layers 113 can be formed by treating one or both surfaces of the diamond layer 110 with DC plasma in a hydrogen atmosphere. The ciliary diamond layers 113 may also be formed on fibrous or microcrystalline diamond layers, which will be described below. The cilia typically have end diameters of several to tens of nanometers and lengths of several to hundreds of micrometers.

The polymer adhesive spreads over the cilia to form a thin, adhesive polymer adhesive layer, thus providing especially desirable adhesion. In addition, even if the members 112 are made of materials having different thermal expansion coefficients, the ciliary diamond layers 113 can reduce the thermal stress. The ciliary diamond layers 113 preferably have a thickness of 0.2 to 3 µm. An excessively small thickness cannot provide high adhesion for the ciliary diamond layers 113. On the other hand, an excessively large thickness increases the cost for the ciliary diamond layers 113 and decreases the mechanical strength of the ciliary diamond layers 113 to result in a peeling bonding surface. The other characteristics and conditions such as film thickness are the same as in FIGS. 5A and 5B.

Figure 7A:
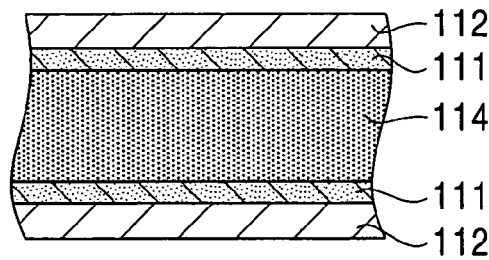
FIG. 7A is a sectional view of a heat spreader according to a seventh embodiment of the present invention.
Figure 7B:
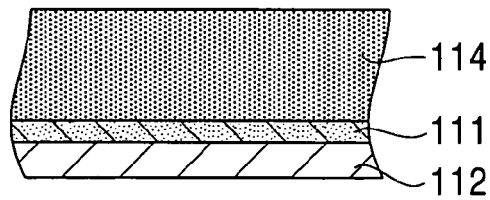
FIG. 7B is a sectional view of a heat spreader according to a modification of the seventh embodiment of the present invention.
Figure 8:
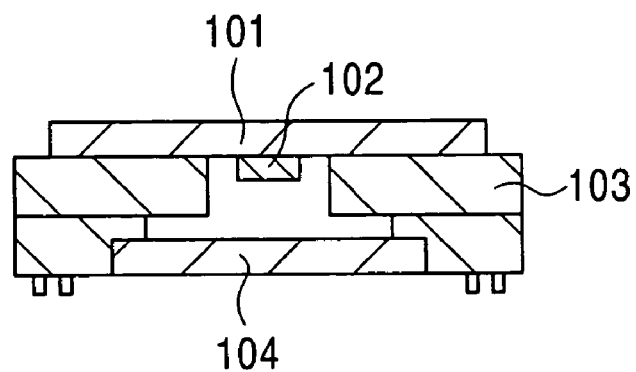
FIG. 8 is a sectional view of a known semiconductor package with a heat spreader.

FIG. 7A is a sectional view of a heat spreader according to a seventh embodiment of the present invention. FIG. 7B is a sectional view of a heat spreader according to a modification of this embodiment. These heat spreaders use a diamond layer 114 having a microcrystalline structure instead of the diamond layer 110 having a fiber structure as shown in FIGS. 5A, 5B, 6A, and 6B. In the heat spreader in FIG. 7A, the members 112 are bonded on the top and bottom surfaces of the diamond layer 114. On the other hand, in the heat spreader in FIG. 7B, one member 112 is bonded on one surface of the diamond layer 114. Such a microcrystalline diamond layer 114 can also provide a thermal conductivity of 500 W/(m·K) or more because diamond has a high thermal conductivity. In addition, the microcrystalline diamond layer 114 can reduce the thermal stress and secure such flatness that the diamond layer 114 can be easily bonded to a semiconductor device or package. Therefore, the microcrystalline diamond layer 114 is as effective as the ciliary diamond layers 113.

An example of methods for depositing the microcrystalline diamond layer 114 will now be described. To control the nucleation density, a diamond powder having an average particle diameter of about 5 nm is applied on a surface of a substrate on which diamond is to be deposited. This substrate is dried, and then introduced into diamond deposition equipment. The reactor of this equipment is evacuated and provided with a mixture of hydrogen gas and 5% to 10% methane gas to maintain a pressure of 100 Torr in the reactor. Then, microwave plasmas are generated in the reactor while the substrate is kept at 800° C. or less. By this method, deposition was performed for 5 hours to form a microcrystalline diamond layer having a diameter of 80 µm.

The polymer adhesive layers 111 are not necessarily used in the fifth to seventh embodiments.

The diamond layers 110 and 114 in FIGS. 5A, 5B, 6A, 6B, 7A, and 7B are separated from substrates. These diamond layers 110 and 114 may be separated by a known method. On the other hand, the diamond layers 110 and 114 are not necessarily separated from the substrates. In this case, only one metal or ceramic member 112 may be bonded on a surface of the diamond layers 110 and 114 facing away from the substrates. In addition, another metal or ceramic member 112 may be bonded on a surface of the substrates facing away from the diamond layers 110 and 114.

EXAMPLES

Examples of the present invention will now be described.

Example 1

A diamond layer having a thermal conductivity of 800 W/(m·K) or more was formed on the reverse surface of a silicon wafer by CVD. This diamond layer, which was a microcrystal having a thickness of 0.05 mm, was notched in advance to make the diamond layer discontinuous. These notches suppress warpage of the wafer and facilitate division of the wafer into chips. Then, semiconductor devices were prepared on a surface of the silicon wafer facing away from the diamond layer. Semiconductor chips with a diamond heat spreader were prepared from this silicon wafer. These chips had an external size of 23 mm by 25 mm and a power consumption of 70 W.

Example 2

Resin wiring substrates were prepared with a liquid crystal polymer as a base resin. The resin wiring substrates each had copper foils thermally compressed on both surfaces. One of these copper foils was etched to form a wiring layer having a pattern, and was then coated with an insulating resin. The semiconductor chips prepared in Example 1 were mounted on the resin wiring substrates by wire bonding to form semiconductor packages having a face-down structure. The semiconductor chips each had 478 pins in the semiconductor packages.

The semiconductor chips in the present invention are not limited to ball grid array (BGA) packages and may be applied to various packages.

Example 3

Ten samples were selected from the semiconductor packages prepared in Example 2. Each heat spreader in these samples was partially coated with aluminum having a thickness of 100 nm to equip the heat spreader with an aluminum radiating fin having an external size of 35 mm by 39 mm. On the other hand, ten additional samples were selected from the semiconductor packages prepared in Example 2. Each heat spreader in these samples was coated with a polymer adhesive on its ciliary surface to equip the heat spreader with the aluminum radiating fin. A heat cycle test was performed on both samples. This test was continued for 500 cycles of −40° C., room temperature, and 110° C. This test showed that the heat spreaders in both samples did not develop cracks or other defects.

Example 4

By the above-described method for depositing a fibrous diamond layer, a diamond layer having a thickness of 50 μm was deposited on a silicon chip of 30 mm by 30 mm. Observation of a cross section of this diamond layer by electron microscopy showed that columnar (fibrous) crystals having a diameter of 2 to 15 μm grew across the thickness.

Another observation showed that a diamond layer prepared by the method for depositing a microcrystalline diamond layer had a microcrystalline structure. Measurements by laser flashing showed that the fibrous diamond layer and the microcrystalline diamond layer have thicknesses of 1500 W/(m·K) or more and 900 W/(m·K) or more, respectively.

Next, an epoxy adhesive having a thickness of about 25 μm was uniformly applied on a surface of a copper foil having a thickness of 50 μm. The adhesive surface of the copper foil was bonded to a surface of the fibrous diamond layer, which was subjected to a pressure of 50 kg/cm² by hot pressing at 150° C. for 15 minutes to cure the adhesive, providing a heat spreader of 30 mm by 30 mm. Through this process, a total of ten heat spreaders were prepared. A heat cycle test (100 cycles of −60° C. to 200° C.) was performed on these heat spreaders, and demonstrated that defects such as peeling and cracking did not occur.

Example 5

Figure 9:
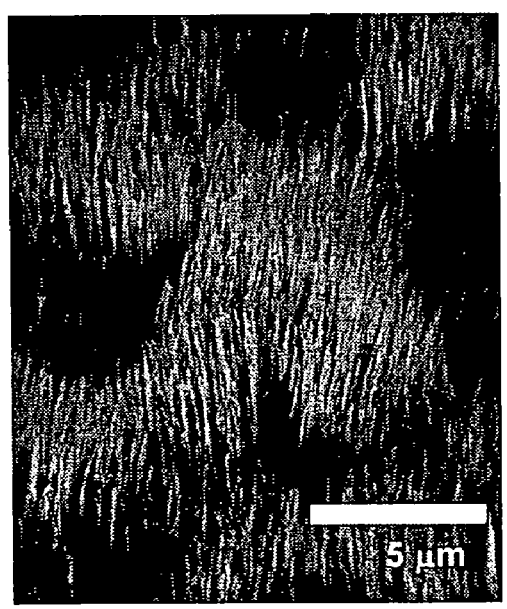
FIG. 9 is an electron micrograph showing a surface of a ciliary diamond layer.

The fibrous diamond layers prepared in Example 4 were treated with DC plasma in a 100% hydrogen atmosphere of 1 Torr for 15 minutes. The resultant diamond layers had a ciliary surface, as shown in an electron micrograph in FIG. 9. As in Example 4, these diamond layers were bonded to copper foils having a thickness of 100 μm, single-crystal silicon substrates, and alumina substrates, none of which caused defects such as peeling and cracking after a thermal shock test and a cycle test.

What is claimed is:

1. A semiconductor device having a heat spreader comprising a diamond-containing material having a thermal conductivity t, where $350 \leq t < 1000$ W/(m·K), the heat spreader being directly disposed entirely or partially on the reverse surface of the semiconductor device, wherein the diamond-containing material is a composite of a diamond layer and a ceramic layer or a mixture of diamond particles and ceramic particles, the ceramic layer or the ceramic particles comprising at least one of silicon carbide and aluminum nitride.

2. The semiconductor device according to claim 1, wherein the heat spreader is directly disposed on a substrate for the semiconductor device.

3. The semiconductor device according to claim 1, wherein the heat spreader has an irregular surface facing away from the semiconductor device.

4. A semiconductor package accommodating the semiconductor device having a heat spreader comprising a diamond-containing material having a thermal conductivity t, where $350 \leq t < 1000$ W/(m·K), the heat spreader being directly disposed entirely or partially on the reverse surface of the semiconductor device, wherein a metal heat sink or a metal radiating fin is bonded on a surface of the heat spreader facing away from the semiconductor device, and the diamond-containing material is a composite of a diamond layer and a ceramic layer or a mixture of diamond particles and ceramic particles, the ceramic layer or the ceramic particles comprising at least one of silicon carbide and aluminum nitride.

5. The semiconductor package according to claim 4, wherein a polymer adhesive layer is used to bond the metal heat sink or the metal radiating fin on the surface of the heat spreader, and cilia are formed on the surface of the heat spreader so that the polymer adhesive layer spreads over part of the cilia.

* * * * *